(12) United States Patent
Motta et al.

(10) Patent No.: US 9,773,930 B2
(45) Date of Patent: *Sep. 26, 2017

(54) INTEGRATED CIRCUIT WITH REFLECTIVE MATERIAL IN TRENCHES AND RELATED METHODS

(71) Applicant: STMICROELECTRONICS S.R.L., Agrate Brianza (IT)

(72) Inventors: Lorenzo Motta, Cernusco sul Naviglio (IT); Claudio Alfonso Giacomo Savoia, Milan (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/240,610

(22) Filed: Aug. 18, 2016

(65) Prior Publication Data

US 2016/0359057 A1 Dec. 8, 2016

Related U.S. Application Data

(63) Continuation of application No. 14/724,270, filed on May 28, 2015, now Pat. No. 9,450,007.

(51) Int. Cl.
*H01L 31/0232* (2014.01)
*H01L 27/146* (2006.01)
(Continued)

(52) U.S. Cl.
CPC .... *H01L 31/02327* (2013.01); *H01L 27/1446* (2013.01); *H01L 27/14629* (2013.01);
(Continued)

(58) Field of Classification Search
CPC ........... H01L 27/1446; H01L 27/14629; H01L 27/14643; H01L 31/02327;
(Continued)

(56) References Cited

U.S. PATENT DOCUMENTS 6,388,278 B1 5/2002 Suzuki et al.
7,262,402 B2 8/2007 Niclass et al.
(Continued)

FOREIGN PATENT DOCUMENTS

EP 2299490 6/2010
EP 2787531 3/2014

OTHER PUBLICATIONS

Itzler et al., "InP-based Geiger-mode avalanche photodiode arrays for three-dimensional imaging at 1.06 um," Proc. of SPIE vol. 7320, Apr. 21, 2009, pp. 73200O-1-73200O-12 (see priority U.S. Appl. No. 14/724,270, filed May 28, 2015).
(Continued)

*Primary Examiner* — Yosef Gebreyesus
(74) *Attorney, Agent, or Firm* — Slater Matsil, LLP

(57) ABSTRACT

An IC may include a substrate and a layer, and an array of GMAPDs in the layer. The layer may have trenches extending between adjacent GMAPDs. The IC may include an optically reflective material within the trenches. The optically reflective material may also be electrically conductive. For example, the optically reflective material may comprise a metal. Also, the trenches may be arranged in a honeycomb pattern.

23 Claims, 3 Drawing Sheets

(51) Int. Cl.
- *H01L 27/144* (2006.01)
- *H01L 31/02* (2006.01)
- *H01L 31/0216* (2014.01)
- *H01L 31/0224* (2006.01)
- *H01L 31/107* (2006.01)
- *H01L 31/18* (2006.01)

(52) U.S. Cl.
CPC .. *H01L 27/14685* (2013.01); *H01L 31/02019* (2013.01); *H01L 31/02161* (2013.01); *H01L 31/022408* (2013.01); *H01L 31/107* (2013.01); *H01L 31/1804* (2013.01); H01L 27/14643 (2013.01)

(58) Field of Classification Search
CPC ......... H01L 31/02019; H01L 31/02161; H01L 31/022408; H01L 31/107; H01L 31/1804
See application file for complete search history.

(56) References Cited

U.S. PATENT DOCUMENTS

| | | | |
|---|---|---|---|
| 8,188,563 B2 | 5/2012 | Finkelstein et al. | |
| 8,664,691 B2 | 3/2014 | Lee | |
| 8,742,528 B2 | 6/2014 | Yamamura et al. | |
| 8,779,543 B2 | 7/2014 | Nemirovsky et al. | |
| 8,828,517 B2 | 9/2014 | Wang et al. | |
| 9,450,007 B1* | 9/2016 | Motta | H01L 27/14629 |
| 2007/0182949 A1 | 8/2007 | Niclass | |
| 2009/0121306 A1 | 5/2009 | Ishikawa | |
| 2009/0184384 A1 | 7/2009 | Sanfilippo et al. | |
| 2009/0256223 A1 | 10/2009 | Yamamura et al. | |
| 2010/0133636 A1 | 6/2010 | Richardson et al. | |
| 2010/0304521 A1 | 12/2010 | Seutter et al. | |
| 2011/0256654 A1 | 10/2011 | Moslehi et al. | |
| 2012/0133956 A1* | 5/2012 | Findlay | H01L 31/173 356/614 |
| 2012/0153423 A1 | 6/2012 | Lee | |
| 2013/0193546 A1 | 8/2013 | Webster et al. | |
| 2014/0167200 A1 | 6/2014 | Sun et al. | |
| 2014/0217264 A1 | 8/2014 | Shepard et al. | |
| 2014/0291481 A1 | 10/2014 | Zhang et al. | |

OTHER PUBLICATIONS

Itzler et al., "Geiger-mode avalanche photodiode focal plane arrays for three-dimensional imaging LADAR," Proc. of SPIE 7808, Aug. 2, 2010, 14 pages (see priority U.S. Appl. No. 14/724,270, filed May 28, 2015).

* cited by examiner

INTEGRATED CIRCUIT WITH REFLECTIVE MATERIAL IN TRENCHES AND RELATED METHODS

CROSS REFERENCE TO RELATED APPLICATIONS

This application is a continuation of pending U.S. patent application Ser. No. 14/724,270 filed May 28, 2015, which is hereby incorporated herein in its entirety by reference.

TECHNICAL FIELD

The present disclosure relates to the field of integrated circuits, and, more particularly, to integrated circuits with a photodiode array and related methods.

BACKGROUND

An integrated circuit (IC) sensor device may have a plurality of pixels arranged in an array of rows and columns, a plurality of pixel lines coupled to the plurality of pixels, and readout circuitry coupled to the plurality of pixel lines. In some applications, each pixel comprises a single photon avalanche diode (SPAD).

The SPAD is based on a p-n junction device biased beyond its breakdown region. The high reverse bias voltage generates a large enough electric field such that a single charge carrier introduced into the depletion layer of the device can cause a self-sustaining avalanche via impact ionization. The avalanche is quenched, either actively or passively, to allow the device to be "reset" to detect further photons. The initiating charge carrier can be photo-electrically generated by a single incident photon striking the high field region. It is this feature which gives rise to the name "Single Photon Avalanche Diode." This single photon detection mode of operation is often referred to as Geiger Mode, i.e. a Geiger mode avalanche photodiode (GMAPD).

U.S. Pat. No. 7,262,402 to Niclass et al. discloses an imaging device using an array of SPADs for capturing a depth and intensity map of a scene, when the scene is illuminated by an optical pulse. U.S. Patent Application No. 2007/0182949 to Niclass discloses an arrangement for measuring the distance to an object. The arrangement uses a modulated photonic wave to illuminate the object and an array of SPADs to detect the reflected wave. Various methods of analysis are disclosed to reduce the effects of interference in the reflected wave.

SUMMARY

Generally, an IC may comprise a substrate and at least one layer thereon, and an array of GMAPDs in the at least one layer. The at least one layer may have a plurality of trenches therein extending between adjacent GMAPDs. The IC may include an optically reflective material within the plurality of trenches.

More specifically, the optically reflective material may also be electrically conductive. For example, the optically reflective material may comprise at least one metal. The plurality of trenches may be arranged in a honeycomb pattern.

In some embodiments, the at least one layer comprises a stacked arrangement of semiconductor layers. The plurality of trenches may extend through the cap layer and vertically downward into the substrate. Each GMAPD may comprise a front side contact layer above the at least one layer. The IC may further include a passivation layer above the at least one layer. Also, the IC may further include a backside contact layer on the substrate opposite the at least one layer.

Another aspect is directed to a method for making an IC. The method may include forming a substrate and at least one layer thereon, and forming an array of GMAPDs in the at least one layer. The method may include forming a plurality of trenches in the at least one layer and extending between adjacent GMAPDs. The method may include forming an optically reflective material within the plurality of trenches.

DETAILED DESCRIPTION

The present disclosure will now be described more fully hereinafter with reference to the accompanying drawings, in which several embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

Figure 1:
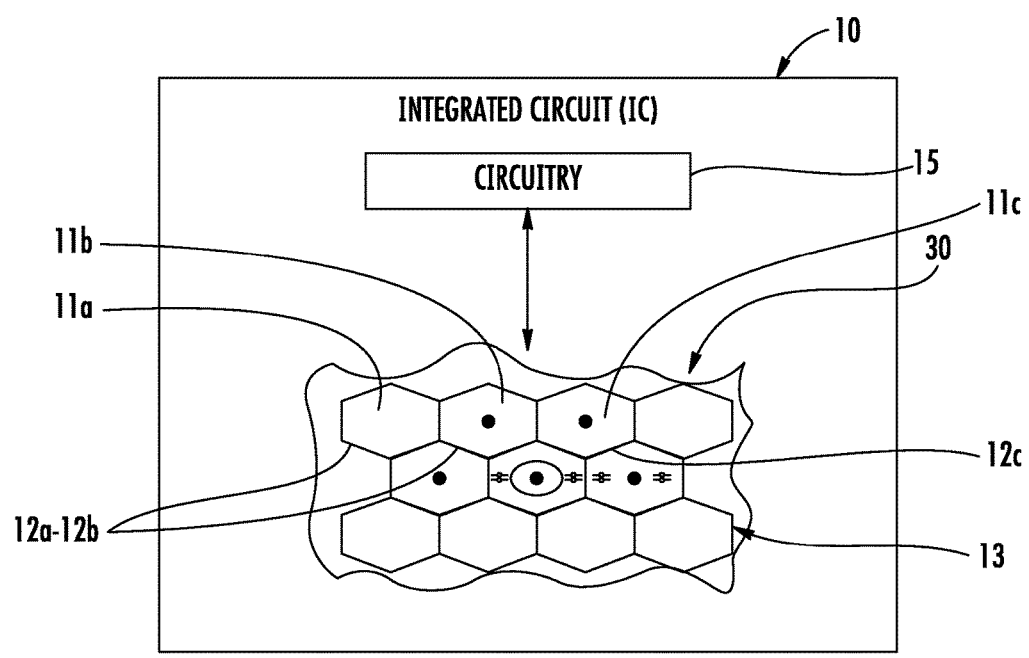
FIG. 1 is a schematic diagram of an IC, according to the present disclosure.
Figure 2:
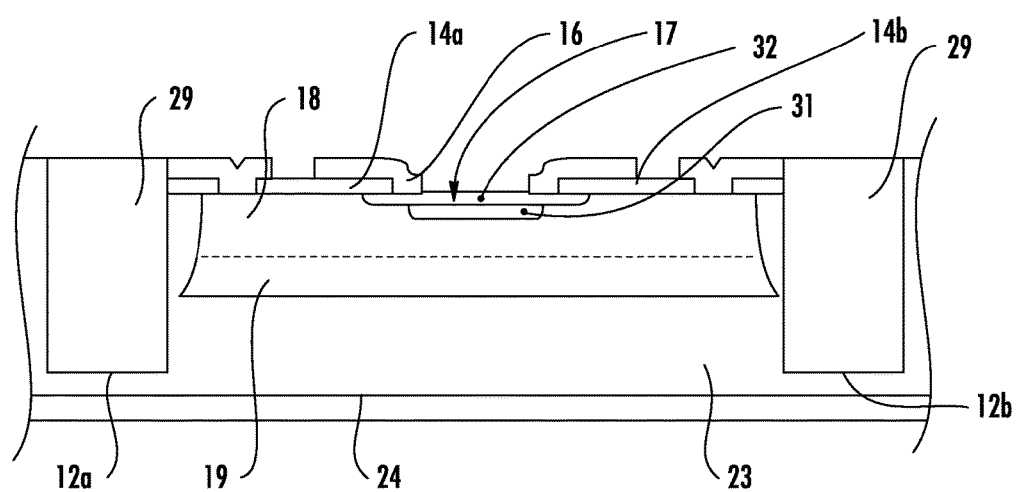
FIG. 2 is a schematic cross-section view of a portion of the array from the IC of FIG. 1.

Referring to FIGS. 1-2, an IC 10 according to the present disclosure is now described. The IC 10 illustratively includes circuitry 15, and an array 30 of GMAPDs 11a-11c coupled thereto (e.g. via pixel lines). The circuitry 15 may comprise decoding/readout circuitry, for example, provided by a general purpose processor.

The IC 10 illustratively includes a substrate 23, such as, silicon or any other semiconductor material (e.g. Si, InGaAs) (having a first conductivity type, e.g. N-type), and a stacked arrangement of layers 18-19, 31-32 on the substrate. The array 30 of GMAPDs 11a-11c is formed in the stacked arrangement of layers 18-19, 31-32 (e.g. Si with different dopant concentrations being used, InP and InGaAs sandwich arrangement). The stacked arrangement of layers 18-19, 31-32 may have a plurality of trenches 12a-12c therein extending vertically between adjacent GMAPDs 11a-11c.

The IC 10 illustratively includes an optically reflective material 29 within the plurality of trenches 12a-12c. The plurality of trenches 12a-12c is completely etched and filled with a metallic material to shield the adjacent GMAPDs 11a-11c, serving as a radiation barrier and avoiding shorting electrically the metallic material filling of the plurality of trenches with any active electrically conductive layer. To avoid that issue, in some embodiments, the IC 10 may include a thin dielectric layer (not shown, e.g. silicon oxide) between the substrate 23 and the optically reflective material 29. The thin dielectric layer is deposited after the trench etching process, as a conformal coating, and before the trenches metal deposition.

In particular, the optically reflective material 29 acts as a mirror for photons created by avalanche action within a respective GMAPD 11a-11c. As perhaps best seen in FIG. 1, the plurality of trenches 12a-12c is illustratively arranged in a honeycomb pattern 13, forming hexagonal cells around each GMAPD 11a-11c. Advantageously, the honeycomb pattern 13 provides a geometric structure that maximizes the number of GMAPD 11a-11c in the array 30. More specifically, the optically reflective material 29 is also electrically conductive. For example, the optically reflective material 29 may comprise at least one material having a large and complex valued refractive index, i.e. any metal, such as Aluminum, Silver, Copper, Gold or any of their alloys. Helpfully, the manufacturer will use the same metal materials in during IC manufacture, i.e. Aluminum, Copper or their alloys.

In the illustrated embodiment, the stacked arrangement of layers comprises a first well 19 having a second conductivity (e.g. P-type) type opposite to that of the substrate 23, and a second well 18 of the second conductivity type and having a dopant concentration level less than the first well. The plurality of trenches 12a-12c illustratively extends through the first and second wells 18-19 and vertically downward into the substrate 23, thereby preventing electrical short circuits and confining photons with the respective GMAPD 11a-11c. The second well 18 illustratively includes a second conductivity type sinker region 31 therein.

Each GMAPD 11a-11c illustratively includes a front side contact layer (e.g. copper, aluminum, silicon, Al/Si, Al/Si/Cu, Al/Cu) 14a-14b above the stacked arrangement of layers 18-19, 31-32. The IC 10 illustratively includes a passivation layer 16 above the stacked arrangement of layers 18-19, 31-32. Also, the IC 10 illustratively includes a backside contact layer (e.g. copper, aluminum, silicon, Al/Si, Al/Si/Cu, Al/Cu) 24 on the substrate 23 opposite the stacked arrangement of layers 18-19, 31-32. The backside contact layer 24 is common to all the GMAPDs 11a-11c in the array 30. Each GMAPD 11a-11c illustratively includes a photodiode junction 17 defined by the sinker region 31 (second conductivity type), and another semiconductor layer (first conductivity type) 32.

Another aspect is directed to a method for making an IC 10. The method may include forming a substrate 23 and at least one layer 18-19, 31-32 thereon, and forming an array 30 of GMAPDs 11a-11c in the at least one layer. The method may include forming a plurality of trenches 12a-12c in the at least one layer 18-19, 31-32 and extending between adjacent GMAPDs 11a-11c. In some embodiments, the plurality of trenches 12a-12c may be formed using a Focused Ion Beam (FIB) milling process, for example. The method may include forming an optically reflective material 29 within the plurality of trenches 12a-12c. The forming of the optically reflective material 29 may be performed via a FIB deposition process, for example.

Figure 3:
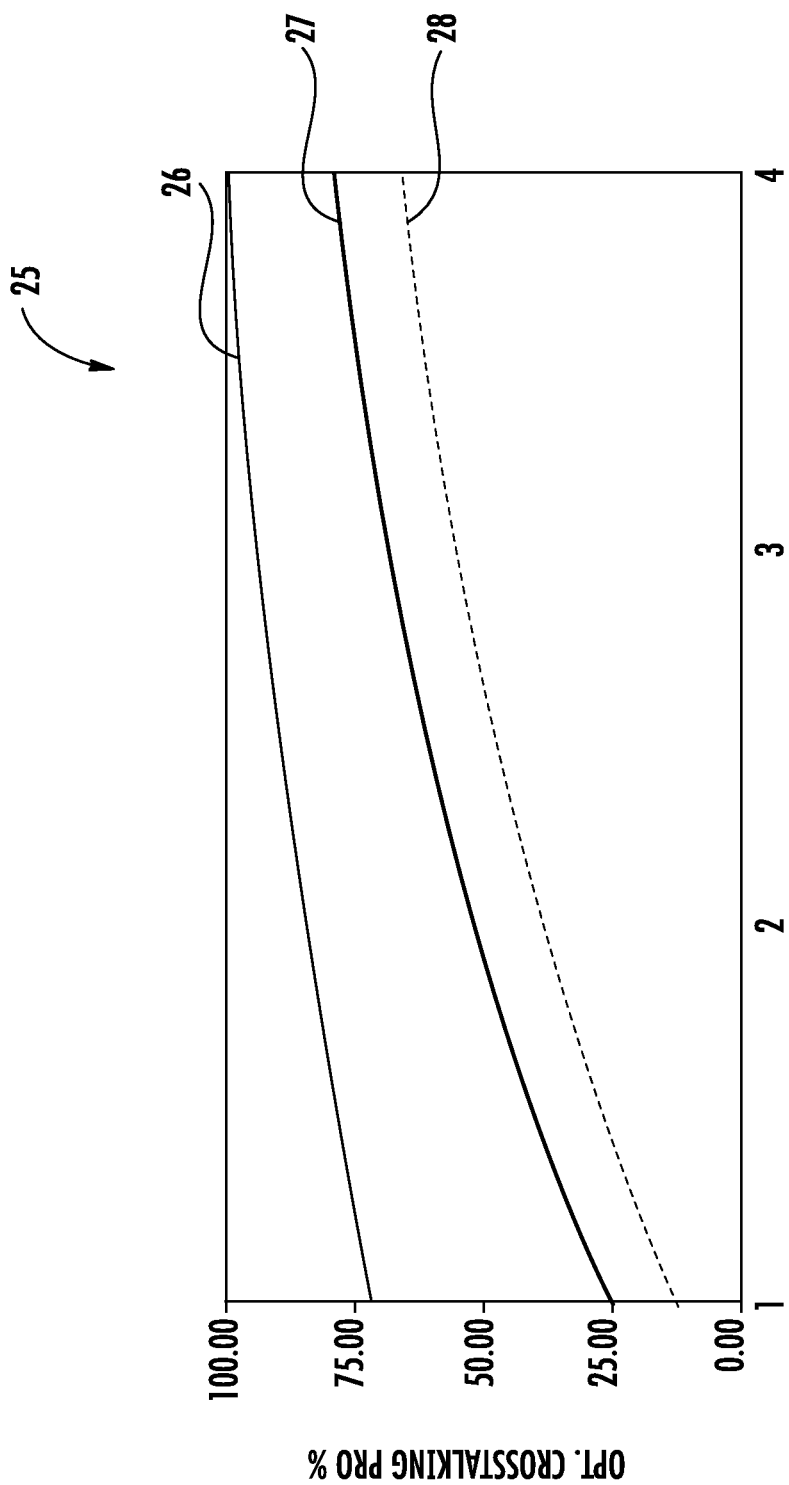
FIG. 3 is a chart of cross-talk probability in the array from the IC of FIG. 1.

Referring now additionally to FIG. 3 and the chart 25 therein, the chart includes several curves 26-28 illustrating the probability of cross-talk between GMAPDs 11a-11c in an array 30. Curve 26 illustrates performance for a prior art array without any trenches, and curve 27 illustrates performance of a prior art array with typical trenches. Curve 28 illustrates performance for the array 30 in the IC 10. Advantageously, the array 30 may provide for a reduced probability of cross-talk between adjacent GMAPDs 11a-11c.

The process of photon detection in an array 30 of SPADs/GMAPDs 11a-11c is based on the generation of photon avalanches with reasonably detectable signals, but not all the avalanche photons are absorbed in the detector due to scattering phenomena in the device. The probability of a scattered photon is greater when the diodes are closer to each other (i.e. densely packed arrays) or/and when the bias applied to the diodes is greater. This can limit the distance between the detectors in arrays and/or their bias voltage.

The IC 10 provides an approach to the prior art problem of cross-talk noise in arrays of SPADs/GMAPDs, which is a function of the diode's excess bias voltage and/or distance therebetween. The IC 10 provides an approach that may reduce the noise level reducing the cross-talk detections and allow high integration of arrays/matrix of detectors and/or to obtain a higher sensitivity increasing the diode bias.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An integrated circuit (IC) comprising:
   a substrate and at least one layer thereon;
   an array of Geiger mode avalanche photodiodes (GMAPDs) in said at least one layer;
   said at least one layer having a plurality of trenches therein extending between adjacent GMAPDs, each of said plurality of trenches extending vertically into said substrate from an upper surface thereof, each of the plurality of trenches comprising sidewalls extending from the upper surface and a bottom surface;
   a dielectric layer conformally coating the sidewalls and the bottom surface, the dielectric layer having a first portion coating the sidewalls and a second portion coating the bottom surface; and
   an optically reflective metal filling the plurality of trenches, the optically reflective metal directly and physically contacting both the first and the second portions of the dielectric layer coating the sidewalls and the bottom surface.

2. The IC of claim 1 wherein the plurality of trenches are arranged in a honeycomb pattern.

3. The IC of claim 1 wherein said at least one layer comprises a well region having a doping type opposite to the substrate.

4. The IC of claim 3 wherein the plurality of trenches deeper than the well region.

5. The IC of claim 1 wherein each GMAPD comprises a front side contact layer above said at least one layer.

6. The IC of claim 1 further comprising a passivation layer above said at least one layer.

7. The IC of claim 1 further comprising a backside contact layer on said substrate opposite said at least one layer.

8. An integrated circuit (IC) comprising:
   a substrate and at least one layer thereon;
   an array of Geiger mode avalanche photodiodes (GMAPDs) in said at least one layer;
   said at least one layer having a plurality of trenches therein extending between adjacent GMAPDs, each of said plurality of trenches extending vertically into said substrate from an upper surface thereof, each of the plurality of trenches comprising sidewalls and a bottom surface; and
   an optically reflective material comprising metal and filling each of said plurality of trenches from the bottom surface of the plurality of trenches up to the upper surface of said substrate.

9. The IC of claim 8 wherein the plurality of trenches are arranged in a honeycomb pattern.

10. The IC of claim 8 wherein said at least one layer comprises a stacked arrangement of semiconductor layers.

11. The IC of claim 10 wherein the plurality of trenches extends through said stacked arrangement of semiconductor layers.

12. The IC of claim 8 wherein each GMAPD comprises a front side contact layer above said at least one layer.

13. The IC of claim 8 further comprising a passivation layer above said at least one layer.

14. The IC of claim 8 further comprising a backside contact layer on said substrate opposite said at least one layer.

15. The IC of claim 8 further comprising a dielectric layer between the substrate and the optically reflective material.

16. A method for making an integrated circuit (IC) comprising:
    forming at least one layer on a substrate;
    forming an array of Geiger mode avalanche photodiodes (GMAPDs) in the at least one layer;
    forming a plurality of trenches in the at least one layer and extending between adjacent GMAPDs, each of the plurality of trenches extending vertically into the substrate from an upper surface thereof, each of the plurality of trenches comprising sidewalls and a bottom surface; and
    filling each of the plurality of trenches from the bottom surface of the plurality of trenches up to the upper surface of the substrate with an optically reflective material comprising metal.

17. The method of claim 16 wherein the plurality of trenches are arranged in a honeycomb pattern.

18. The method of claim 16 wherein the at least one layer comprises a stacked arrangement of semiconductor layers.

19. The method of claim 18 wherein the plurality of trenches extends through the stacked arrangement of semiconductor layers.

20. The method of claim 16 wherein each GMAPD comprises a front side contact layer above the at least one layer.

21. The method of claim 16 further comprising forming a passivation layer above the at least one layer.

22. The method of claim 16 further comprising forming a backside contact layer on the substrate opposite the at least one layer.

23. The method of claim 16 further comprising forming a dielectric layer between the substrate and the optically reflective material.

* * * * *